(12) United States Patent
Tamaru

(10) Patent No.: US 10,910,690 B2
(45) Date of Patent: Feb. 2, 2021

(54) DIRECTIONAL COUPLER

(71) Applicant: Murata Manufacturing Co., Ltd., Nagaokakyo (JP)

(72) Inventor: Ikuo Tamaru, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 57 days.

(21) Appl. No.: 16/124,276

(22) Filed: Sep. 7, 2018

(65) Prior Publication Data

US 2019/0006729 A1 Jan. 3, 2019

Related U.S. Application Data

(63) Continuation of application No. PCT/JP2016/087776, filed on Dec. 19, 2016.

(30) Foreign Application Priority Data

Mar. 18, 2016 (JP) .................... 2016-055214

(51) Int. Cl.
| | |
|---|---|
| H01P 5/18 | (2006.01) |
| H01P 5/12 | (2006.01) |
| H03H 7/48 | (2006.01) |
| H01G 4/40 | (2006.01) |
| H01P 3/08 | (2006.01) |
| H03H 1/00 | (2006.01) |
| H03H 7/01 | (2006.01) |
| H01G 4/30 | (2006.01) |
| H01G 4/38 | (2006.01) |

(52) U.S. Cl.
CPC ............... *H01P 5/185* (2013.01); *H01G 4/40* (2013.01); *H01P 3/08* (2013.01); *H01P 5/184* (2013.01); *H03H 1/00* (2013.01); *H03H 7/0115* (2013.01); *H03H 7/48* (2013.01); *H01G 4/30* (2013.01); *H01G 4/385* (2013.01); *H03H 2001/0085* (2013.01)

(58) Field of Classification Search
CPC ...................................... H01P 5/12; H01P 5/18
USPC ........................................ 333/109–112, 116
See application file for complete search history.

(56) References Cited

U.S. PATENT DOCUMENTS

| | | |
|---|---|---|
| 2012/0319797 A1 | 12/2012 | Tamaru |
| 2013/0300518 A1 | 11/2013 | Tamaru |
| | (Continued) | |

FOREIGN PATENT DOCUMENTS

| | | |
|---|---|---|
| JP | 11-220312 A | 8/1999 |
| JP | 2002-280812 A | 9/2002 |
| | (Continued) | |

OTHER PUBLICATIONS

Official Communication issued in International Patent Application No. PCT/JP2016/087776, dated Jan. 24, 2017.

*Primary Examiner* — Dean O Takaoka
(74) *Attorney, Agent, or Firm* — Keating & Bennett, LLP

(57) ABSTRACT

A directional coupler that achieves flattening of a coupling characteristic and size reduction or miniaturization is used in a predetermined frequency band and includes a first terminal, a second terminal, a third terminal, a fourth terminal, a main line, and a sub line. The main line is connected between the first terminal and the second terminal. The sub line is connected between the third terminal and the fourth terminal. In the sub line, a low-pass filter is provided.

20 Claims, 8 Drawing Sheets

(56) References Cited

U.S. PATENT DOCUMENTS

| | | | |
|---|---|---|---|
| 2015/0236666 A1* | 8/2015 | Ootsuka | H01P 5/185 333/109 |
| 2015/0263406 A1* | 9/2015 | Ohashi | H01P 5/187 333/110 |
| 2016/0172740 A1* | 6/2016 | Srirattana | H01P 5/185 333/111 |
| 2017/0040661 A1* | 2/2017 | Ashida | H01P 5/18 |

FOREIGN PATENT DOCUMENTS

| | | |
|---|---|---|
| JP | 2007-181063 A | 7/2007 |
| JP | 2013-005076 A | 1/2013 |
| WO | 2012/124374 A1 | 9/2012 |

* cited by examiner

<THIRD EMBODIMENT>

DIRECTIONAL COUPLER

CROSS REFERENCE TO RELATED APPLICATIONS

This application claims the benefit of priority to Japanese Patent Application No. 2016-055214 filed on Mar. 18, 2016 and is a Continuation Application of PCT Application No. PCT/JP2016/087776 filed on Dec. 19, 2016. The entire contents of each application are hereby incorporated herein by reference.

BACKGROUND OF THE INVENTION

1. Field of the Invention

The present invention relates to directional couplers, and, more particularly, to a directional coupler for use in, for example, a radio communication apparatus to perform communication using a high-frequency signal.

2. Description of the Related Art

A directional coupler is known which includes a main line and a sub line electromagnetically coupled to the main line and can output a signal of power proportional to power of a signal passing through the main line from the sub line. A directional coupler is used to keep the power level of a transmission signal constant in a radio communication apparatus, such as a smartphone for performing radio communication using a high-frequency signal. Specifically, using a signal output from the sub line when the transmission signal passes through the main line, feedback control is performed to keep the power of the transmission signal constant.

From the viewpoint of the increase in accuracy of feedback control, it is desirable that, in the frequency characteristic (coupling characteristic) of a coupling degree that is the ratio (attenuation) between the power of a signal passing through the main line and the power of a signal output from the sub line, the amount of change in the coupling degree is suppressed (hereinafter also referred to as "flattened") with respect to the change in the frequency of a signal passing through the main line.

It is known that a coupling characteristic can be flattened by setting the length of each of the main line and the sub line to a length substantially equal to a quarter of the wavelength (hereinafter also referred to as "one quarter-wavelength") of a signal of a frequency passing through the main line. However, for example, in a high-frequency band of 0.7 GHz to 2.7 GHz, the one quarter-wavelength is approximately 1.4 cm or greater. The allowable size of a directional coupler used in a portable radio communication apparatus that is strongly demanded to be reduced in size is several millimeters. Accordingly, it is difficult to set the length of each of the main line and the sub line in the directional coupler to the one quarter-wavelength.

In order to realize size reduction or miniaturization of a radio communication apparatus, a directional coupler including a main line and a sub line each of which is shorter than one quarter-wavelength is sometimes used. However, it is known that the coupling characteristic of such a directional coupler increases with the increase in the frequency of a signal passing through the main line.

As a directional coupler that overcomes such a problem, Japanese Unexamined Patent Application Publication No. 2013-5076 discloses a configuration in which a low-pass filter is connected between two sub lines. The low-pass filter causes the phase shift of a signal passing therethrough. As a result of this operation of the low-pass filter, the coupling characteristic of the directional coupler can be flattened.

In the directional coupler disclosed in Japanese Unexamined Patent Application Publication No. 2013-5076, the low-pass filter includes a coil. In order to secure an inductance required for the acquisition of the function of the low-pass filter, a line is usually wound around the coil a plurality of times. In a case in which the directional coupler includes a multilayer body including dielectrics, a dielectric layer is required for each winding of a line electrode. Accordingly, the coil may become an obstacle to the further size reduction of the directional coupler.

SUMMARY OF THE INVENTION

Preferred embodiments of the present invention provide directional couplers with which the flattening of a coupling characteristic and size reduction or miniaturization are able to be achieved.

A directional coupler according to a preferred embodiment of the present invention is used in a predetermined frequency band. The directional coupler includes first to fourth terminals, a main line, and a sub line. The main line is connected between the first terminal and the second terminal. The sub line is connected between the third terminal and the fourth terminal. A low-pass filter is provided in the sub line.

Using directional couplers according to preferred embodiments of the present invention, the flattening of a coupling characteristic and size reduction or miniaturization are realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
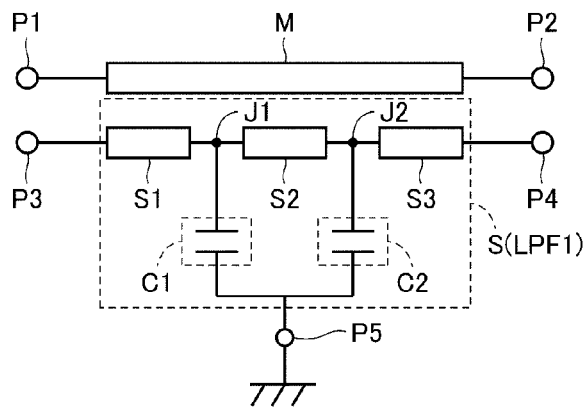
FIG. 1 is an equivalent circuit diagram of a directional coupler according to a first preferred embodiment of the present invention.

Preferred embodiments of the present invention will be described in detail below with reference to the accompanying drawings. In the drawings, the same reference numeral is used to represent the same elements or portions or the corresponding elements or portions so as to avoid repeated explanation.

First Preferred Embodiment

FIG. 1 is an equivalent circuit diagram of a directional coupler 1 according to a first preferred embodiment of the present invention. The directional coupler 1 is used in a radio communication apparatus that performs communication in, for example, the frequency band of about 0.7 GHz to about 2.7 GHz. A communication method performed in this frequency band is, for example, LTE (Long Term Evolution).

As illustrated in FIG. 1, the directional coupler 1 includes electrodes (terminals) P1 to P5 connected to an external apparatus, a main line M, and a sub line S. The sub line S includes capacitors C1 and C2. The sub line S is divided into sub lines S1, S2, and S3. The sub lines S1, S2, and S3 and the capacitors C1 and C2 define a low-pass filter LPF1.

The terminal P1 defines an input port. The terminal P2 defines an output port. The terminal P3 defines a coupling port. The terminal P4 defines a termination port terminated at about 50Ω, for example. The terminal P5 defines a grounding port connected to a ground potential. When a signal transmits from the terminal P1 to the terminal P2, a signal of power proportional to the power of the signal is output from the terminal P3.

The main line M is connected between the terminals P1 and P2. The sub lines S1, S2, and S3 are connected in series in this order between the terminals P3 and P4. Each of the sub lines S1, S2, and S3 is electromagnetically coupled to the main line M. The degree of coupling between the sub line S3 and the main line M is lower than the degree of electromagnetic coupling between the sub line S1 and the main line M and higher than the degree of electromagnetic coupling between the sub line S2 and the main line M.

The sub line S1 is also electromagnetically coupled to the sub lines S2 and S3. The sub line S2 is also electromagnetically coupled to the sub line S3. The degree of coupling between the sub lines S2 and S3 is higher than the degree of electromagnetic coupling between the sub lines S1 and S3. The degree of electromagnetic coupling between the sub lines S1 and S3 is higher than the degree of electromagnetic coupling between the sub lines S1 and S2.

The capacitor C1 is connected between a node J1 and the terminal P5. The node J1 is between the sub lines S1 and S2. The capacitor C2 is connected between a node J2 and the terminal P5. The node J2 is between the sub lines S2 and S3. The capacitance of the capacitor C2 is larger than that of the capacitor C1.

A cutoff frequency at which the attenuation (dB) of a signal flowing between the terminals P3 and P4 decreases by a predetermined value (for example, about 3 dB) is set so as not to be included in a frequency band used by the directional coupler 1. In the first preferred embodiment, the cutoff frequency is preferably set to about 6.8 GHz higher than a frequency band (about 0.7 GHz to about 2.7 GHz) used by the directional coupler 1.

In a case in which a signal is output from the terminal P1 to the terminal P2, the directional coupler 1 is about to output from the terminal P3 a signal of power proportional to the power of the signal because each of the sub lines S1, S2, and S3 is electromagnetically coupled to the main line M. The directional coupler 1 keeps the power level of a transmission signal constant or substantially constant in a radio communication apparatus, such as a smartphone that performs radio communication using a high-frequency signal. Specifically, using a signal output from the terminal P3 (coupling port) when a transmission signal input into the terminal P1 (input port) passes through the main line M, feedback control is performed such that the power of the transmission signal becomes constant or substantially constant. In the following description, a coupling degree means the ratio (attenuation) between the power of a signal input from the input port and the power of a signal output from the coupling port.

For example, in a case in which a frequency a signal passing through the main line M varies in the range of about 0.7 GHz to about 2.7 GHz, it is preferable that a coupling characteristic be constant or substantially constant in order to increase the accuracy of the feedback control.

It is known that a coupling characteristic is able to be flattened by setting the length of each of the main line and the sub line to the one quarter-wavelength. However, in a case in which the frequency band of a transmission signal is, for example, a high-frequency band of about 0.7 GHz to about 2.7 GHz, the one quarter-wavelength is approximately 1.4 cm or greater. The allowable size of a directional coupler used in a portable radio communication apparatus, such as a smartphone for which there is a strong demand to be reduced in size is several millimeters. Accordingly, it is difficult to set the length of each of the main line and the sub line to the one quarter-wavelength.

Figure 2A:
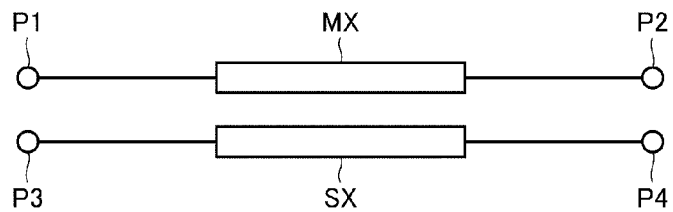
FIGS. 2A and 2B are equivalent circuit diagrams of a directional coupler that is a comparative example.

By setting the length of each of the main line and the sub line to a length shorter than the one quarter-wavelength, size reduction or miniaturization is able to be achieved. As an example of such a directional coupler, a directional coupler 901 that is a first comparative example is illustrated in FIG. 2A. FIG. 2A is an equivalent circuit diagram of the directional coupler 901. As illustrated in FIG. 2A, the directional coupler 901 includes a main line MX and a sub line SX. The main line MX is connected between the terminals P1 and P2. The sub line SX is connected between the terminals P3 and P4. The main line MX and the sub line SX are electromagnetically coupled to each other.

Since the length of each of the main line MX and the sub line SX is shorter than the one quarter-wavelength, the directional coupler 901 is able to be further miniaturized as compared to a directional coupler including a main line and a sub line that are one quarter-wavelength long. However, it is known that the coupling characteristic of the directional coupler 901 increases with the increase in the frequency of a signal passing through the main line MX.

Figure 2B:
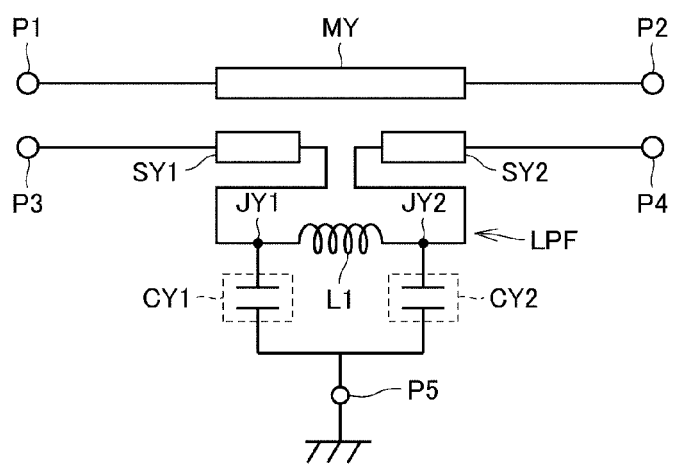

Examples of a method of flattening a coupling characteristic include a method of shifting the phase of a signal passing through the sub line. As an example of such a directional coupler, a directional coupler 902 that is a second comparative example is illustrated in FIG. 2B. FIG. 2B is an equivalent circuit diagram of the directional coupler 902. As illustrated in FIG. 2B, the directional coupler 902 includes a main line MY, sub lines SY1 and SY2, and a low-pass filter LPF. The main line MY is connected between the terminals P1 and P2. The sub line SY1, the low-pass filter LPF, and the sub line SY2 are connected in series in this order between the terminals P3 and P4. Each of the sub lines SY1 and SY2 is electromagnetically coupled to the main line MY. However, the sub lines SY1 and SY2 are not electromagnetically coupled to each other.

The low-pass filter LPF includes a coil L1 and the capacitors C1 and C2. The coil L1 is connected between the sub lines SY1 and SY2. The capacitor C1 is connected between a node JY1 and the terminal P5. The node JY1 is between the sub line SY1 and the coil L1. The capacitor C2 is connected between a node JY2 and the terminal P5. The node JY2 is between the coil L1 and the sub line SY2. The coil L1 is not electromagnetically coupled to the main line MY.

A phase shift is produced in a signal passing through the low-pass filter LPF. When a signal transmits from the terminal P1 to the terminal P2 on the main line MY, a first Y signal generated by the electromagnetic coupling between the main line MY and the sub line SY1 does not pass through the low-pass filter LPF. On the other hand, when a second Y signal generated by the electromagnetic coupling between the main line MY and the sub line SY2 passes through the low-pass filter LPF, a phase shift is produced in the second Y signal. A signal output from the terminal P3 when a signal transmits from the terminal P1 to the terminal P2 on the main line MY is a signal obtained by combining the first Y signal and the second Y signal between which there is a phase difference. Accordingly, the amplitude of the signal obtained by combining the first Y signal and the second Y signal is reduced as compared to the case in which there is little difference between these signals. As a result, the coupling characteristic of the directional coupler 902 is able to be close to flat.

In order to secure an inductance required for the function of the low-pass filter LPF, a line electrode is usually wound around the coil L1 included in the low-pass filter LPF a plurality of times. In a case in which the directional coupler 902 includes a multilayer body including dielectrics, a dielectric layer is required for each winding of the line electrode. In order to maintain the function of the low-pass filter LPF, the main line MY and the coil L1 need to be sufficiently separated from each other so as not to be electromagnetically coupled to each other. Accordingly, the coil L1 may prevent the further size reduction of the directional coupler.

In the directional coupler 1 according to the first preferred embodiment, the sub line S2 that is electromagnetically coupled to the main line M is used instead of the coil L1. When a signal transmits from the terminal P1 to the terminal P2 on the main line M, the sub line S3 and the main line M are electromagnetically coupled to each other. The degree of electromagnetic coupling between the sub lines S2 and S3 is higher than the degree of electromagnetic coupling between the sub lines S1 and S3. The mutual inductance between the sub lines S2 and S3 is larger than the mutual inductance between the sub lines S1 and S3 and the mutual inductance between the sub lines S1 and S2. With this configuration, a phase shift produced when a signal passes through the sub line S2 is able to be increased. As a result, the coupling characteristic of the directional coupler 1 is able to be flattened.

Signals generated by the electromagnetic coupling between the main line M and the respective sub lines S1, S2, and S3 are defined as first to third signals, respectively. A signal output from the terminal P3 when a signal transmits from the terminal P1 to the terminal P2 on the main line M is a signal obtained by combining the first to third signals. In the directional coupler 1, the degree of coupling between the sub line S3 and the main line M is lower than the degree of the electromagnetic coupling between the sub line S1 and the main line M and is higher than the degree of the electromagnetic coupling between the sub line S2 and the main line M. With this configuration, the amplitude of the third signal whose phase is shifted at the time of passage through the sub line S2 is larger than that of the second signal. The amplitude of a signal output from the terminal P3 is therefore further reduced. As a result, the coupling characteristic of the directional coupler 1 is able to be further flattened.

In the first preferred embodiment, the sub line S1 is electromagnetically coupled to the sub lines S2 and S3. With this configuration, a circuit including the sub lines S1, S2, and S3 has a combined inductance that is a result of addition of the self-inductances of the respective sub lines and the mutual inductance obtained by the electromagnetic coupling between the sub lines. Accordingly, a line length required to secure a required inductance is able to be shortened as compared to the case in which there is no electromagnetic coupling between sub lines. As a result, the directional coupler 1 is able to be further reduced in size.

In the directional coupler 1, the degree of the electromagnetic coupling between the sub lines S2 and S3 is higher than the degree of the electromagnetic coupling between the sub lines S1 and S3. The degree of the electromagnetic coupling between the sub lines S1 and S3 is higher than the degree of the electromagnetic coupling between the sub lines S1 and S2. With this configuration, the mutual inductance between the sub lines S2 and S3 is larger than the mutual inductance between the sub lines S1 and S3 and the mutual inductance between the sub lines S1 and S2. A phase shift produced when the third signal passes through the sub line S2 is therefore able to be increased. As a result, the coupling characteristic of the directional coupler 1 is able to be further flattened.

Since the mutual inductance between the sub lines S2 and S3 is larger than the mutual inductance between the sub lines S1 and S2, the capacitance of the capacitor C2 is set to be larger than that of the capacitor C1 to adjust the impedance of the directional coupler to a characteristic impedance (for example, about 50Ω).

Figure 3:
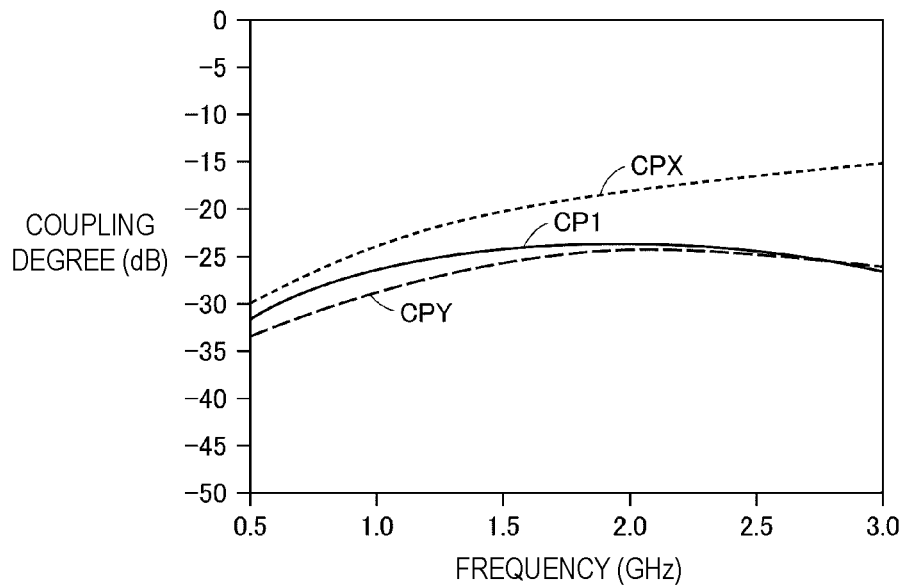
FIG. 3 is a diagram illustrating the coupling characteristic of a directional coupler according to the first preferred embodiment of the present invention and the coupling characteristics of directional couplers that are comparative examples.

FIG. 3 is a diagram illustrating the coupling characteristic (a curve CP1) of the directional coupler 1 according to the first preferred embodiment, the coupling characteristic (a curve CPX) of the directional coupler 901 that is a comparative example, and the coupling characteristic (a curve CPY) of the directional coupler 902 that is a comparative example. As illustrated in FIG. 3, the increase in the coupling degree with the increase in frequency is reduced in the coupling characteristic CPY of the directional coupler 902 as compared to the coupling characteristic CPX of the directional coupler 901. The increase in the coupling degree with the increase in frequency is similarly reduced in the coupling characteristic CP1 of the directional coupler 1 as compared to the coupling characteristic CPX of the directional coupler 901.

In the directional coupler 1, an additional coil is not required for phase shifting. A dielectric layer is therefore not needed for each winding of a coil. In addition, the sub line S2 and the main line M do not need to be separated from each other so as not to be electromagnetically coupled to each other. As a result, the directional coupler 1 is able to be miniaturized.

Figure 4:
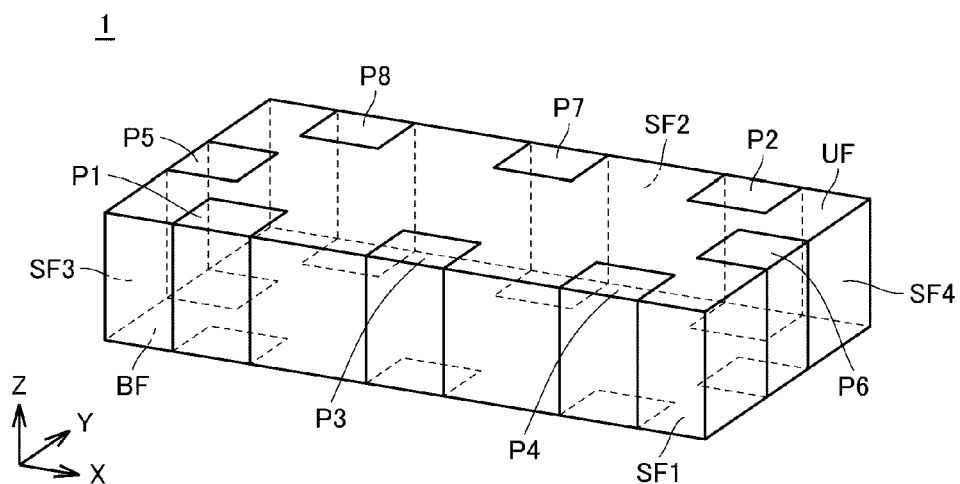
FIG. 4 is an external perspective view of a directional coupler according to the first preferred embodiment of the present invention.

A case is which the directional coupler 1 includes a multilayer body including a plurality of dielectrics will be described below. In the following, as illustrated in FIG. 4, a dielectric lamination direction (the height direction of the directional coupler 1) is defined as a Z-axis direction, the long-side (width) direction of the directional coupler 1 is defined as an X-axis direction, and the short-side (depth) direction of the directional coupler 1 is defined as a Y-axis direction. The X axis, the Y axis, and the Z axis are orthogonal or substantially orthogonal to one another.

FIG. 4 is an external perspective view of the directional coupler 1 according to the first preferred embodiment. As illustrated in FIG. 4, the directional coupler 1 is preferably, for example, a rectangular or substantially rectangular parallelepiped. In the directional coupler 1, surfaces perpendicular or substantially perpendicular to the lamination direction are defined as a bottom surface BF and an upper surface UF. Among surfaces parallel or substantially parallel to the lamination direction, surfaces parallel or substantially parallel to the ZX plane are defined as side surfaces SF1 and SF2 and surfaces parallel or substantially parallel to the YZ plane are defined as side surfaces SF3 and SF4. Each of the terminals P1, P3, and P4 extends from the upper surface UF to the bottom surface BF via the side surface SF1. Each of the terminals P2, P7, and P8 extends from the upper surface UF to the bottom surface BF via the side surface SF2. The terminal P5 extends from the upper surface UF to the bottom surface BF via the side surface SF3. A terminal P6 extends from the upper surface UF to the bottom surface BF via the side surface SF4.

Figure 5:
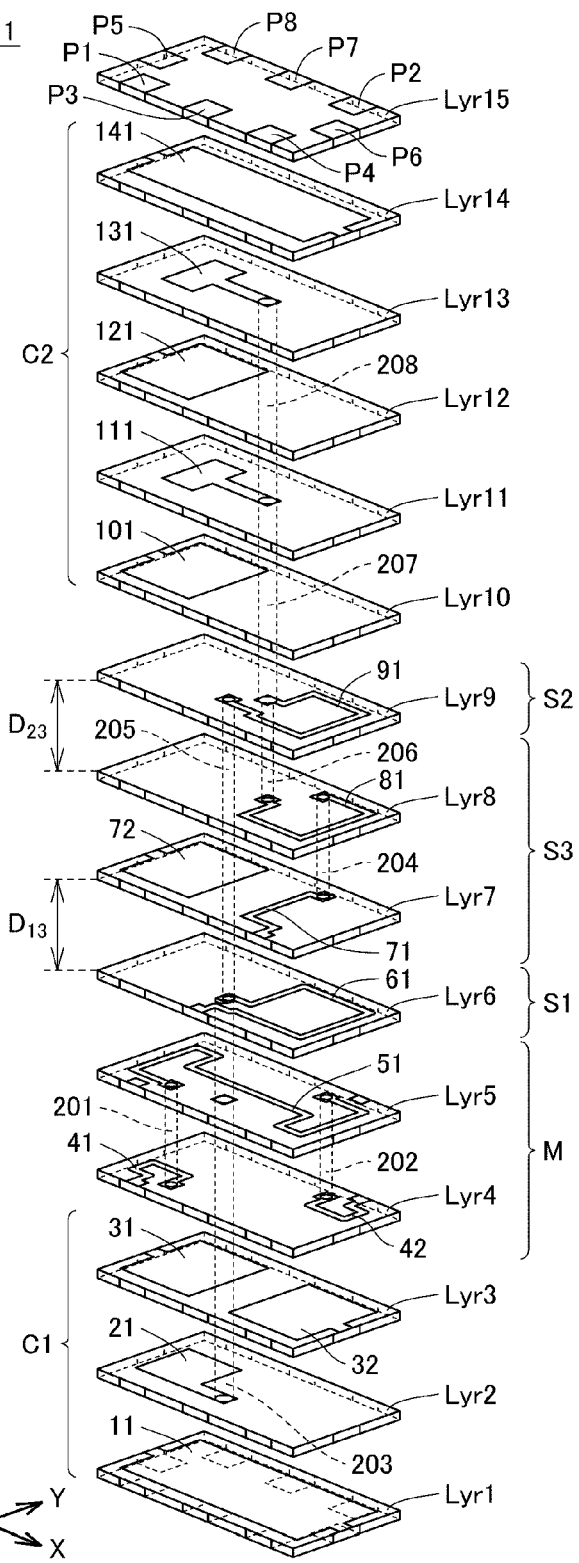
FIG. 5 is an exploded perspective view of a directional coupler according to the first preferred embodiment of the present invention.

FIG. 5 is an exploded perspective view of the directional coupler 1 according to the first preferred embodiment. As illustrated in FIG. 5, the directional coupler 1 includes a plurality of dielectric layers Lyr1 to Lyr15. The dielectric layers Lyr1 to Lyr15 are laminated in this order from the side of the bottom surface to the side of the upper surface in the Z-axis direction. At the dielectric layer Lyr1, a ground electrode 11 is provided. The ground electrode 11 is connected to the terminals P5 and P6. At the dielectric layer Lyr2, a capacitor electrode 21 is provided. At the dielectric layer Lyr3, ground electrodes 31 and 32 are provided. The ground electrode 31 is connected to the terminal P5, and the ground electrode 32 is connected to the terminal P6. The ground electrode 31 corresponds to a first ground electrode. The ground electrode 32 corresponds to a third ground electrode. The ground electrode 11, the capacitor electrode 21, and the ground electrode 31 that overlap as viewed from the lamination direction define the capacitor C1. The dielectric layers Lyr1 to Lyr3 correspond to a first capacitor layer.

At the dielectric layer Lyr4, line electrodes 41 and 42 are provided. The line electrode 41 is connected to the terminal P1. The line electrode 42 is connected to the terminal P2. At the dielectric layer Lyr5, a line electrode 51 is provided. The line electrodes 51 and 41 are connected by a via electrode 201. The line electrodes 51 and 42 are connected by a via electrode 202. The line electrode 41, the line electrode 42, the via electrode 201, the via electrode 202, and the line electrode 51 define the main line M. The dielectric layers Lyr4 and Lyr5 correspond to a main line layer.

At the dielectric layer Lyr6, a line electrode 61 is provided. The line electrode 61 is connected to the terminal P3. The line electrode 61 and the capacitor electrode 21 are connected by a via electrode 203. The line electrode 61 corresponds to the sub line S1. The dielectric layer Lyr6 corresponds to a first sub line layer.

At the dielectric layer Lyr7, a line electrode 71 and a ground electrode 72 are provided. The ground electrode 72 corresponds to a second ground electrode. The line electrode 71 is connected to the terminal P4. The ground electrode 72 is connected to the terminal P5. At the dielectric layer Lyr8, a line electrode 81 is provided. The line electrode 81 and the line electrode 71 are connected by a via electrode 204. The line electrode 71, the via electrode 204, and the line electrode 81 constitute the sub line S3. The dielectric layers Lyr7 and Lyr8 correspond to a third sub line layer.

At the dielectric layer Lyr9, a line electrode 91 is provided. The line electrodes 91 and 61 are connected by a via electrode 205. The line electrodes 91 and 81 are connected by a via electrode 206. The line electrode 91 corresponds to the sub line S2. The dielectric layer Lyr9 corresponds to a second sub line layer.

At the dielectric layer Lyr10, a ground electrode 101 is provided. The ground electrode 101 is connected to the terminal P5. At the dielectric layer Lyr11, a capacitor electrode 111 is provided. The capacitor electrode 111 and the line electrode 91 are connected by a via electrode 207. At the dielectric layer Lyr12, a ground electrode 121 is provided. The ground electrode 121 is connected to the terminal P5. At the dielectric layer Lyr13, a capacitor electrode 131 is provided. The capacitor electrodes 131 and 111 are connected by a via electrode 208. At the dielectric layer Lyr14, a ground electrode 141 is provided. The ground electrode 141 is connected to the terminals P5 and P6. The ground electrode 141 corresponds to a fourth ground electrode. The ground electrode 101, the capacitor electrode 111, the ground electrode 121, the capacitor electrode 131, and the ground electrode 141 that overlap one another as viewed from the lamination direction define the capacitor C2. The dielectric layers Lyr10 to Lyr14 correspond to a second capacitor layer. The number of capacitor electrodes defining the capacitor C2 is larger than the number of capacitor electrodes defining the capacitor C1. The capacitance of the capacitor C2 is therefore larger than that of the capacitor C1.

In the directional coupler 1, the main line layer (Lyr4 and Lyr5), the first sub line layer (Lyr6), the second sub line layer (Lyr9), and the third sub line layer (Lyr7) and Lyr8) are disposed between the first capacitor layer (Lyr1 to Lyr3) and the second capacitor layer (Lyr10 to Lyr14). With this arrangement, the first capacitor layer and the second capacitor layer are sufficiently separated from each other. Accordingly, the flexibility of design, such as the order in which the main line layer and the first to third sub line layers are laminated, is improved.

The first sub line layer is disposed between the main line layer and the third sub line layer. The third sub line layer is disposed between the first sub line layer and the second sub line layer. With this arrangement, the distance between the third sub line layer and the main line layer is longer than the distance between the first sub line layer and the main line layer and is shorter than the distance between the second sub line layer and the main line layer. As a result, the degree of the electromagnetic coupling between the sub line S3 and the main line M is lower than the degree of the electromagnetic coupling between the sub line S1 and the main line M and higher than the degree of the electromagnetic coupling between the sub line S2 and the main line M.

A distance D23 between the dielectric layers Lyr8 and Lyr9 is set to be shorter than a distance D12 between the dielectric layers Lyr6 and Lyr7. With this setting, the distance between the second sub line layer and the third sub line layer is shorter than the distance between the first sub line layer and the third sub line layer. As a result, the degree of the electromagnetic coupling between the sub lines S2 and S3 is higher than the degree of the electromagnetic coupling between the sub lines S1 and S3.

Figure 6:
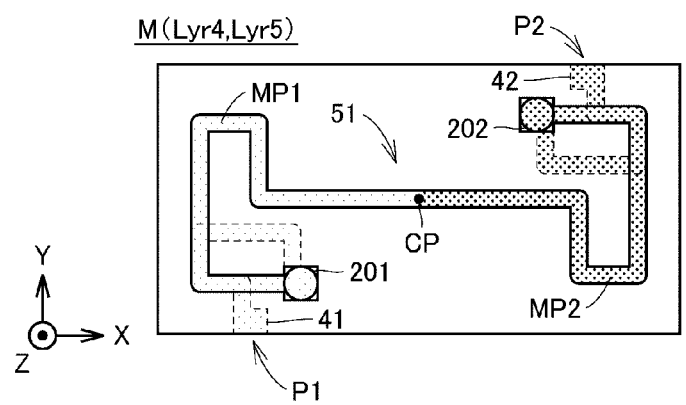
FIG. 6 is plan view of overlapping dielectric layers corresponding to a main line layer.

FIG. 6 is plan view of overlapping dielectric layers Lyr5 and Lyr4 corresponding to the main line layer. As illustrated in FIG. 6, the main line M (the line electrode 41, the line electrode 42, the via electrode 201, the via electrode 202, and the line electrode 51) is divided into a first portion MP1 between the terminal P1 and a center point CP and a second portion MP2 between the terminal P2 and the center point CP. The line length between the terminal P1 and the center point CP and the line length between the terminal P2 and the center point CP are preferably the same or substantially the same. The first portion includes the line electrode 41, the via electrode 201, and a portion of the line electrode 51 extending from the center point CP to the via electrode 201. The second portion includes the line electrode 42, the via electrode 202, and a portion of the line electrode 51 extending from the center point CP to the via electrode 202.

Referring to FIGS. 5 and 6, the ground electrode 31 (the first ground electrode) and the ground electrode 72 (the second ground electrode) overlap in the direction in which the dielectric layers are laminated. The ground electrode 32 (the third ground electrode) and the ground electrode 141 (the fourth ground electrode) overlap in the lamination direction. The distance between the ground electrodes 31 and 72 is shorter than the distance between the ground electrodes 32 and 141. The first sub line layer (Lyr6), the second sub line layer (Lyr9), and the third sub line layer (Lyr7 and Lyr8) are disposed between the ground electrodes 32 and 141. The ground electrodes 31 and 72 overlap the first portion MP1 of the main line M in the lamination direction. The ground electrodes 31 and 72 do not overlap the sub line S1 (the line electrode 61), the sub line S2 (the line electrode 91), and the sub line S3 (the line electrode 71, the via electrode 204, and the line electrode 81). The ground electrodes 32 and 141 overlap the second portion MP2 of the main line M, the sub line S1, the sub line S2, and the sub line S3 in the lamination direction.

With this arrangement, the impedance of the directional coupler 1 is adjusted to a characteristic impedance (for example, about 50Ω).

Thus, by using the directional coupler 1 according to the first preferred embodiment, the flattening of a coupling characteristic and size reduction or miniaturization is able to be achieved.

Figure 7:
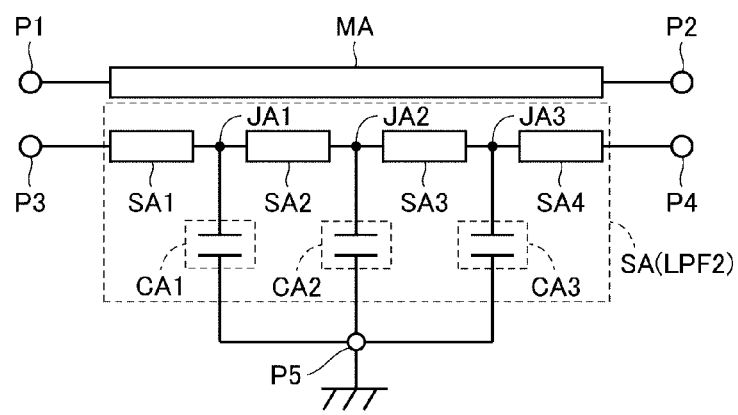
FIG. 7 is an equivalent circuit diagram of a directional coupler that is a modification of the first preferred embodiment of the present invention.

In the first preferred embodiment, the sub line connected between the terminals P3 and P4 is preferably divided into three sub lines, for example. The sub line connected between the terminals P3 and P4 may be divided into four or more sub lines. FIG. 7 is an equivalent circuit diagram of a directional coupler 1A in which a sub line connected between the terminals P3 and P4 is divided into four sub lines. As illustrated in FIG. 7, the directional coupler 1A includes a sub line SA. The sub line SA includes capacitors CA1 to CA3. The sub line SA is divided into sub lines SA1 to SA4. The sub lines SA1 to SA4 are connected in series in this order between the terminals P3 and P4. Each of the sub lines SA1 to SA4 is electromagnetically coupled to the main line M. In the sub line SA, a low-pass filter LPF2 is provided.

The capacitor CA1 is connected between a node JA1 and the terminal P5. The node JA1 is between the sub lines SA1 and SA2. The capacitor CA2 is connected between a node JA2 and the terminal P5. The node JA2 is between the sub lines SA2 and SA3. The capacitor CA3 is connected between a node JA3 and the terminal P5. The node JA3 is between the sub lines SA3 and SA4. The sub lines SA1 to SA4 and the capacitors CA1 to CA3 define the low-pass filter LPF2.

By also using the directional coupler 1A, the flattening of a coupling characteristic and size reduction or miniaturization is able to be achieved.

Second Preferred Embodiment

Figure 8:
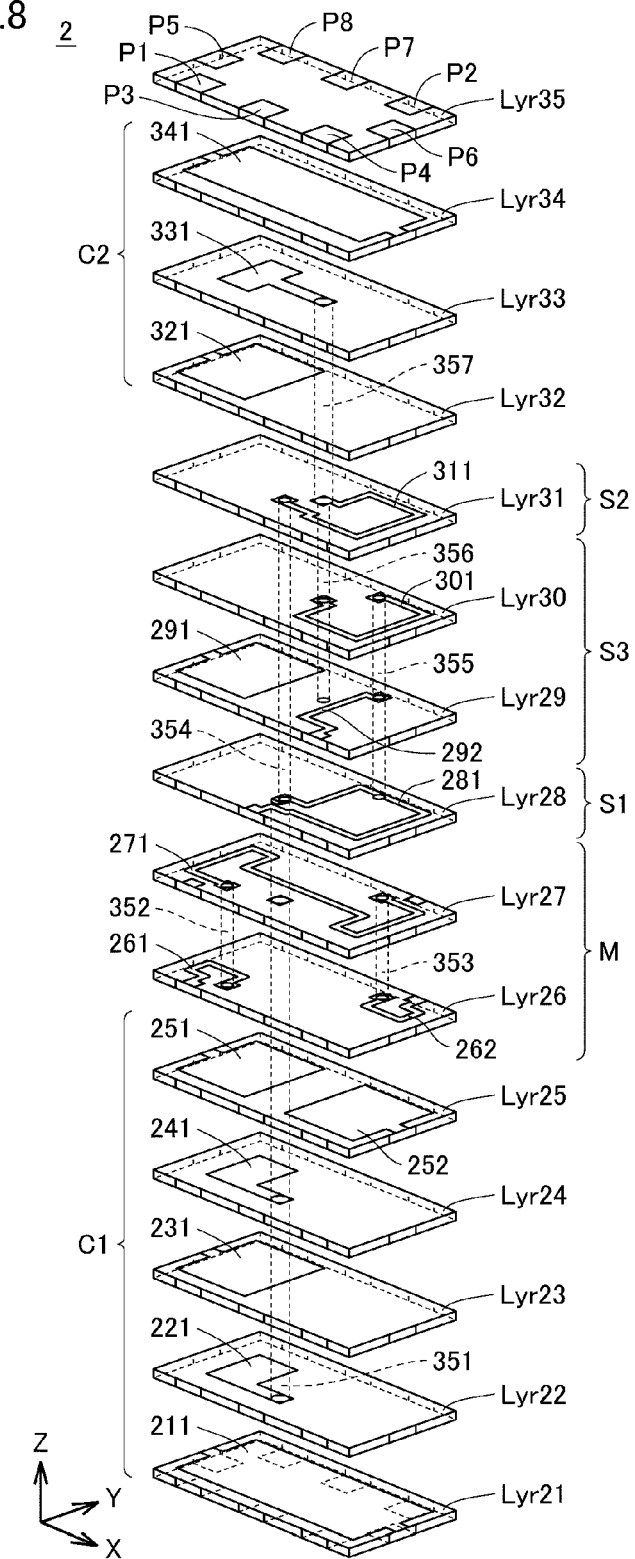
FIG. 8 is an exploded perspective view of a directional coupler according to a second preferred embodiment of the present invention.
Figure 9:
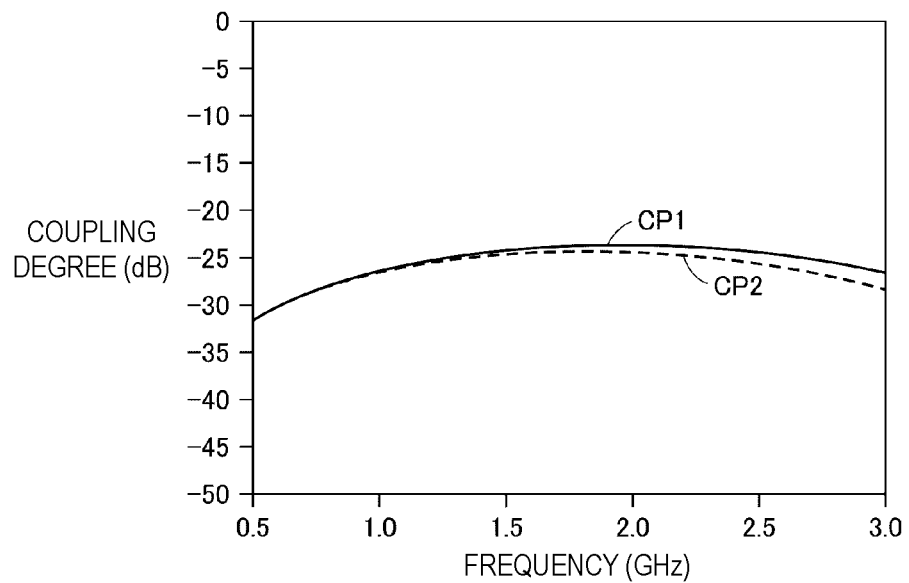
FIG. 9 is a diagram illustrating the coupling characteristic of a directional coupler according to the second preferred embodiment and the coupling characteristic of a directional coupler 1 according to the first preferred embodiment of the present invention.

In the first preferred embodiment, the case in which the capacitance of the capacitor C2 is larger than that of the capacitor C1 has been described. The magnitude relationship between the capacitances of the capacitors C1 and C2 varies in accordance with a characteristic impedance required for a directional coupler. In the second preferred embodiment of the present invention, the case in which the capacitance of the capacitor C2 is smaller than that of the capacitor C1 will be described. The second preferred embodiment differs from the first preferred embodiment in that the capacitance of the capacitor C2 is smaller than that of the capacitor C1. That is, FIGS. 3 and 5 illustrating the first preferred embodiment are replaced by FIGS. 9 and 8 illustrating the second preferred embodiment, respectively. The remaining configuration is the same or substantially the same, and the description thereof is not repeated.

FIG. 8 is an exploded perspective view of a directional coupler 2 according to the second preferred embodiment. As illustrated in FIG. 8, the directional coupler 2 includes a plurality of dielectric layers Lyr21 to Lyr35. The dielectric layers Lyr21 to Lyr35 are laminated in this order from the side of the bottom surface to the side of the upper surface in the Z-axis direction.

At the dielectric layer Lyr21, a ground electrode 211 is provided. The ground electrode 211 is connected to the terminals P5 and P6. As the dielectric layer Lyr22, a capacitor electrode 221 is provided. At the dielectric layer Lyr23, a ground electrode 231 is provided. The ground electrode 231 is connected to the terminal P5. At the dielectric layer Lyr24, a capacitor electrode 241 is provided. The capacitor electrodes 241 and 221 are connected by a via electrode 351. At the dielectric layer Lyr25, ground electrodes 251 and 252 are provided. The ground electrode 251 is connected to the terminal P5, and the ground electrode 252 is connected to the terminal P6. The ground electrode 251 corresponds to the first ground electrode. The ground electrode 252 corresponds to the third ground electrode.

The ground electrode 211, the capacitor electrode 221, the ground electrode 231, the capacitor electrode 241, and the ground electrode 251 that overlap one another as viewed from the lamination direction define the capacitor C1. The dielectric layers Lyr21 to Lyr25 correspond to the first capacitor layer.

At the dielectric layer Lyr26, line electrodes 261 and 262 are provided. The line electrode 261 is connected to the terminal P1. The line electrode 262 is connected to the terminal P2. At the dielectric layer Lyr27, a line electrode 271 is provided. The line electrodes 271 and 261 are connected by a via electrode 352. The line electrodes 271 and 262 are connected by a via electrode 353. The line electrode 261, the line electrode 262, the via electrode 352, the via electrode 353, and the line electrode 271 define the main line M. The dielectric layers Lyr26 and Lyr27 correspond to the main line layer.

At the dielectric layer Lyr28, a line electrode 281 is provided. The line electrode 281 is connected to the terminal P3. The line electrode 281 and the capacitor electrode 241 are connected by the via electrode 351. The line electrode 281 corresponds to the sub line S1. The dielectric layer Lyr28 corresponds to the first sub line layer.

At the dielectric layer Lyr29, a ground electrode 291 and a line electrode 292 are provided. The ground electrode 291 corresponds to the second ground electrode. The ground electrode 291 is connected to the terminal P5. The line electrode 292 is connected to the terminal P4. At the dielectric layer Lyr30, a line electrode 301 is provided. The line electrodes 301 and 292 are connected by a via electrode 355. The line electrode 292, the via electrode 355, and the line electrode 301 define the sub line S3. The dielectric layers Lyr29 and Lyr30 define the third sub line layer.

At the dielectric layer Lyr31, a line electrode 311 is provided. The line electrodes 311 and 281 are connected by a via electrode 354. The line electrodes 311 and 301 are connected by a via electrode 356. The line electrode 311 corresponds to the sub line S2. The dielectric layer Lyr31 corresponds to the second sub line layer.

At the dielectric layer Lyr32, a ground electrode 321 is provided. The ground electrode 321 is connected to the terminal P5. At the dielectric layer Lyr33, a capacitor electrode 331 is provided. The capacitor electrode 331 and the line electrode 311 are connected by a via electrode 357. At the dielectric layer Lyr34, a ground electrode 341 is provided. The ground electrode 341 is connected to the terminals P5 and P6. The ground electrode 341 corresponds to the fourth ground electrode. The ground electrode 321, the capacitor electrode 331, and the ground electrode 341 that overlap one another as viewed from the lamination direction define the capacitor C2. The dielectric layers Lyr32 to Lyr34 correspond to the second capacitor layer. The number of capacitor electrodes defining the capacitor C2 is smaller than the number of capacitor electrodes defining the capacitor C1. The capacitance of the capacitor C2 is therefore smaller than that of the capacitor C1.

FIG. 9 is a diagram illustrating a coupling characteristic CP2 of the directional coupler 2 according to the second preferred embodiment and the coupling characteristic CP1 of the directional coupler 1 according to the first preferred embodiment. In the coupling characteristic CP2 of the directional coupler 2, the increase in the coupling degree with the increase in frequency is reduced or prevented as in the coupling characteristic CP1 of the directional coupler 1. The flattening of the coupling characteristic is achieved.

Thus, by also using the directional coupler 2, the flattening of a coupling characteristic and size reduction or miniaturization is able to be achieved.

Third Preferred Embodiment

In the first preferred embodiment, the directional coupler including a single sub line in which a low-pass filter is provided has been described. Directional couplers according to preferred embodiments of the present invention may include a plurality of sub lines in each of which a low-pass filter is provided. In the third preferred embodiment of the present invention, a directional coupler including two sub lines in each of which a low-pass filter is provided will be described.

Figure 10:
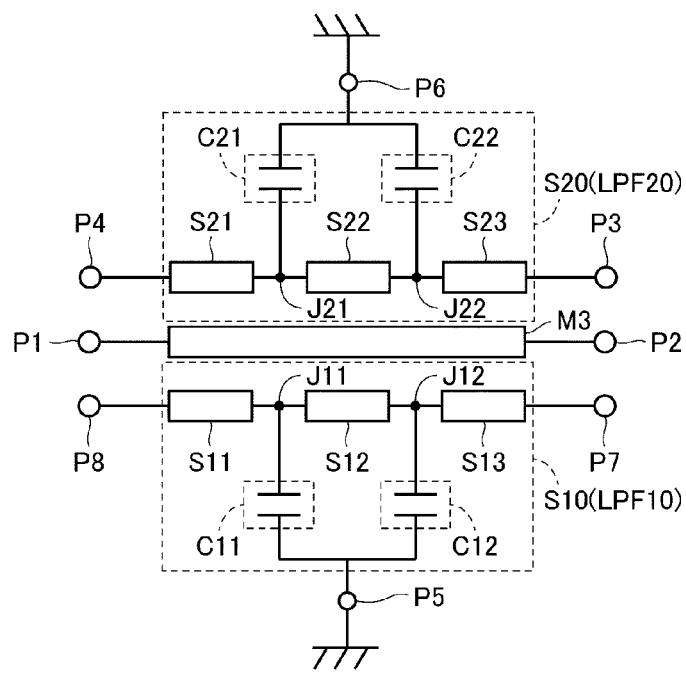
FIG. 10 is an equivalent circuit diagram of a directional coupler according to a third preferred embodiment of the present invention.
Figure 11:
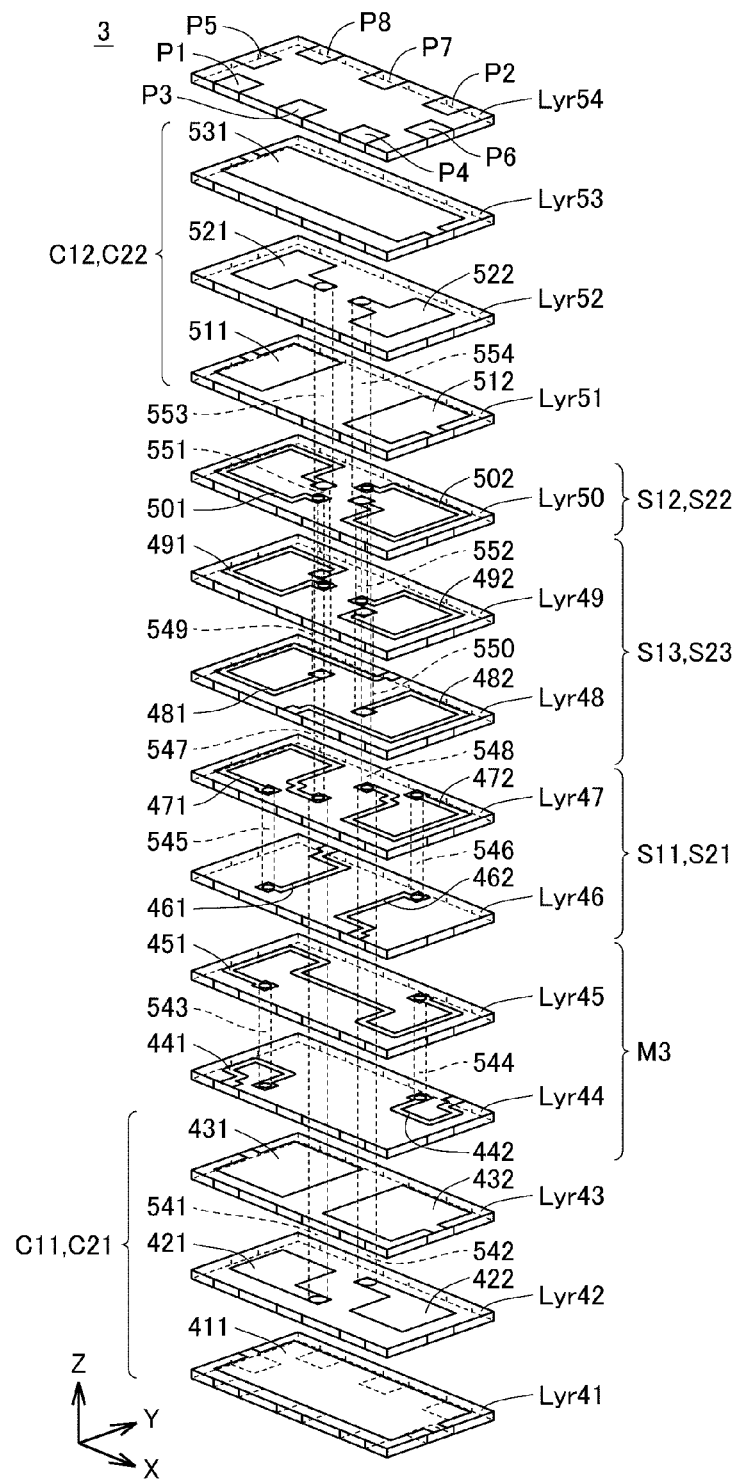
FIG. 11 is an exploded perspective view of a directional coupler according to the third preferred embodiment of the present invention.
Figure 12:
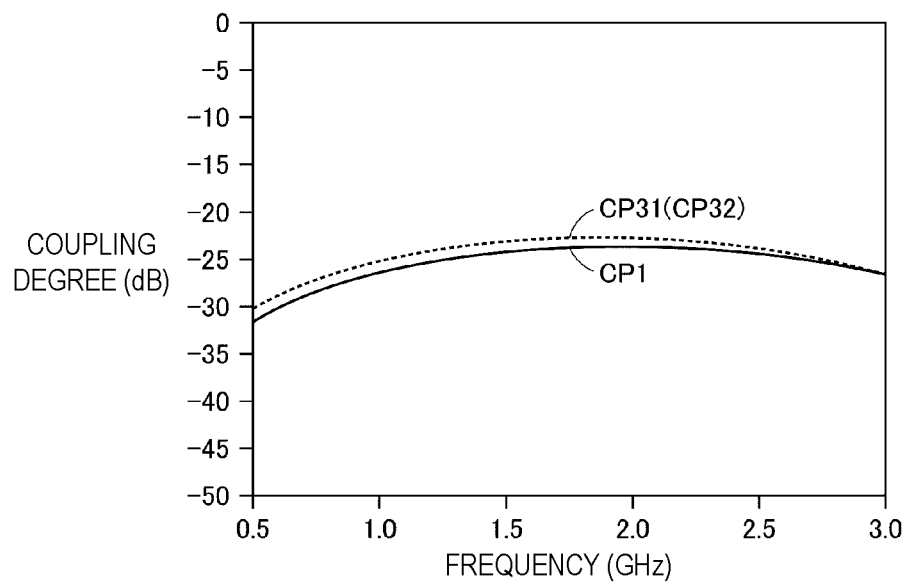
FIG. 12 is a diagram illustrating the coupling characteristic of a directional coupler according to the third preferred embodiment and the coupling characteristic of a directional coupler according to the first preferred embodiment of the present invention.

The third preferred embodiment differs from the first preferred embodiment in that the directional coupler includes two sub lines in each of which a low-pass filter is provided. That is, FIGS. 1, 3, and 5 illustrating the first preferred embodiment are replaced by FIGS. 10, 12, and 11 illustrating the third preferred embodiment, respectively. The remaining configuration is the same or substantially the same, and the description thereof is not repeated.

FIG. 10 is an equivalent circuit diagram of a directional coupler 3 according to the third preferred embodiment. As illustrated in FIG. 10, the directional coupler includes electrodes (terminals) P1 to P8 connected to an external apparatus, a main line M3, and sub lines S10 and S20.

The terminals P4 and P8 define coupling ports. The terminals P3 and P7 define termination ports terminated at about 50Ω, for example. The terminals P5 and P6 define grounding ports connected to a ground potential. When a signal transmits from the terminal P1 to the terminal P2, a signal of power proportional to the power of the signal is output from the terminals P4 and P8.

The main line M3 is connected between the terminals P1 and P2.

The sub line S10 includes capacitors C11 and C12. The sub line S10 is divided into sub lines S11 to S13. The sub lines S11 to S13 and the capacitors C1 and C2 define a low-pass filter LPF10. The sub lines S11 to S13 are connected in series in this order between the terminals P8 and P7. The capacitor C11 is connected between a node J11 and the terminal P5. The node J11 is between the sub lines S11 and S12. The capacitor C12 is connected between a node J12 and the terminal P5. The node J12 is between the sub lines S12 and S13.

Each of the sub lines S11 to S13 is electromagnetically coupled to the main line M3. The degree of coupling between the sub line S13 and the main line M3 is lower than the degree of the electromagnetic coupling between the sub line S11 and the main line M3 and is higher than the electromagnetic coupling between the sub line S12 and the main line M3.

The sub line S20 includes capacitors C21 and C22. The sub line S20 is divided into sub lines S21 to S23. The sub lines S21 to S23 and the capacitors C21 and C22 define a low-pass filter LPF20. The sub lines S21 to S23 are connected in series in this order between the terminals P4 and P3. The capacitor C21 is connected between a node J21 and the terminal P6. The node J21 is between the sub lines S21 and S22. The capacitor C22 is connected between a node J22 and the terminal P6. The node J22 is between the sub lines S22 and S23.

Each of the sub lines S21 to S23 is electromagnetically coupled to the main line M3. The degree of coupling between the sub line S23 and the main line M3 is lower than the electromagnetic coupling between the sub line S21 and the main line M3 and is higher than the electromagnetic coupling between the sub line S22 and the main line M3.

The sub line S21 is also electromagnetically coupled to each of the sub lines S22 and S23. The sub line S22 is also electromagnetically coupled to the sub line S23. The degree of the electromagnetic coupling between the sub lines S21 and S23 is higher than the degree of the electromagnetic coupling between the sub lines S21 and S22.

FIG. 11 is an exploded perspective view of the directional coupler 3 according to the third preferred embodiment. As illustrated in FIG. 11, the directional coupler 3 includes a plurality of dielectric layers Lyr41 to Lyr54. The dielectric layers Lyr41 to Lyr54 are laminated in this order from the side of the bottom surface to the side of the upper surface in the Z-axis direction.

At the dielectric layer Lyr41, a ground electrode 411 is provided. The ground electrode 411 is connected to the terminals P5 and P6. At the dielectric layer Lyr42, capacitor electrodes 421 and 422 are provided. At the dielectric layer Lyr43, ground electrodes 431 and 432 are provided. The ground electrode 431 is connected to the terminal P5. The ground electrode 432 is connected to the terminal P6. The ground electrode 411, the capacitor electrode 421, and the ground electrode 431 that overlap one another as viewed from the lamination direction define the capacitor C11. The ground electrode 411, the capacitor electrode 422, and the ground electrode 432 similarly define the capacitor C21. The dielectric layers Lyr41 to Lyr43 correspond to the first capacitor layer.

At the dielectric layer Lyr44, line electrodes 441 and 442 are provided. The line electrode 441 is connected to the terminal P1. The line electrode 442 is connected to the terminal P2. At the dielectric layer Lyr45, a line electrode 451 is provided. The line electrodes 451 and 441 are connected by a via electrode 543. The line electrodes 451 and 442 are connected by a via electrode 544. The line electrode 441, the line electrode 442, the via electrode 543, the via electrode 544, and the line electrode 451 define the main line M3. The dielectric layers Lyr44 and Lyr45 correspond to the main line layer.

At the dielectric layer Lyr46, line electrodes 461 and 462 are provided. The line electrode 461 is connected to the terminal P8. The line electrode 462 is connected to the terminal P4.

At the dielectric layer Lyr47, line electrodes 471 and 472 are provided. The line electrodes 471 and 461 are connected by a via electrode 545. The line electrode 471 and the capacitor electrode 421 are connected by a via electrode 541. The line electrode 461, the via electrode 545, and the line electrode 471 define the sub line S11. The line electrodes 472 and 462 are connected by a via electrode 546. The line electrode 472 and the capacitor electrode 422 are connected by a via electrode 542. The line electrode 462, the via electrode 546, and the line electrode 472 define the sub line S21. The dielectric layers Lyr46 and Lyr47 correspond to the first sub line layer.

At the dielectric layer Lyr48, line electrodes 481 and 482 are provided. The line electrode 481 is connected to the terminal P7. The line electrode 482 is connected to the terminal P3.

At the dielectric layer Lyr49, line electrodes 491 and 492 are provided. The line electrodes 491 and 481 are connected by a via electrode 549. The line electrode 481, the via electrode 549, and the line electrode 491 define the sub line S13. The line electrodes 492 and 482 are connected by a via electrode 550. The line electrode 482, the via electrode 550, and the line electrode 492 define the sub line S23. The dielectric layers Lyr48 and Lyr49 correspond to the third sub line layer.

At the dielectric layer Lyr50, line electrodes 501 and 502 are provided. The line electrodes 501 and 471 are connected by a via electrode 547. The line electrodes 501 and 491 are connected by a via electrode 551. The line electrode 501 defines the sub line S12. The line electrodes 502 and 472 are connected by a via electrode 548. The line electrodes 502 and 492 are connected by a via electrode 552. The line electrode 502 defines the sub line S22. The dielectric layer Lyr50 corresponds to the second sub line layer.

At the dielectric layer Lyr51, ground electrodes 511 and 512 are provided. The ground electrode 511 is connected to the terminal P5. The ground electrode 512 is connected to the terminal P6.

At the dielectric layer Lyr52, capacitor electrodes 521 and 522 are provided. The capacitor electrode 521 and the line electrode 501 are connected by a via electrode 553. The capacitor electrode 522 and the line electrode 502 are connected by a via electrode 554.

At the dielectric layer Lyr53, a ground electrode 531 is provided. The ground electrode 531 is connected to the terminals P5 and P6. The ground electrode 511, the capacitor electrode 521, and the ground electrode 531 that overlap one another as viewed from the lamination direction define the capacitor C12. The ground electrode 512, the capacitor electrode 522, and the ground electrode 531 similarly define the capacitor C22. The dielectric layers Lyr51 to Lyr53 corresponds to the second capacitor layer.

FIG. 12 is a diagram illustrating coupling characteristics CP31 and CP32 of the directional coupler 3 according to the third preferred embodiment and the coupling characteristic CP1 of the directional coupler 1 according to the first preferred embodiment. One of the coupling characteristics of the directional coupler 3 is the coupling characteristic (CP31) obtained in the case in which the coupling port is the terminal P4 and the other one of them is the coupling characteristic (CP32) obtained in the case in which the coupling port is the terminal P8. Since the curves of the coupling characteristics CP31 and CP32 are the same or almost the same in the frequency band illustrated in FIG. 12, they are represented by the same curve in FIG. 12. In the coupling characteristics CP31 and CP32 of the directional coupler 3, the increase in the coupling degree with the increase in frequency is reduced or prevented as in the coupling characteristic CP1 of the directional coupler 1. The flattening of the coupling characteristics is achieved.

Thus, by also using the directional coupler 3, the flattening of a coupling characteristic and size reduction or miniaturization is able to be achieved. In addition, by using the directional coupler 3, signals of power proportional to the power of a signal passing through the main line are able to be output from a plurality of sub lines (coupling ports).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A directional coupler used in a predetermined frequency band comprising:
   first, second, third, and fourth terminals;
   a main line connected between the first terminal and the second terminal; and
   a sub line connected between the third terminal and the fourth terminal; wherein
   a low-pass filter is provided in the sub line and is defined by at least a portion of the sub line.

2. The directional coupler according to claim 1, wherein the sub line is divided into at least a first sub line, a second sub line, and a third sub line;
   the directional coupler further includes:
   a first capacitor provided between a ground potential and a first node between the first sub line and the second sub line; and a second capacitor provided between the ground potential and a second node between the second sub line and the third sub line;

the first sub line, the second sub line, and the third sub line are connected in series in this order and are each electromagnetically coupled to the main line; and the first sub line, the second sub line, the third sub line, the first capacitor, and the second capacitor define the low-pass filter.

3. The directional coupler according to claim 2, wherein the second sub line is electromagnetically coupled to the third sub line.

4. The directional coupler according to claim 3, wherein the first sub line is electromagnetically coupled to each of the second sub line and the third sub line;

a degree of electromagnetic coupling between the second sub line and the third sub line is higher than a degree of electromagnetic coupling between the first sub line and the third sub line; and the degree of electromagnetic coupling between the first sub line and the third sub line is higher than a degree of electromagnetic coupling between the first sub line and the second sub line.

5. The directional coupler according to claim 4, wherein a capacitance of the second capacitor differs from a capacitance of the first capacitor.

6. The directional coupler according to claim 2, wherein a degree of electromagnetic coupling between the third sub line and the main line is higher than a degree of electromagnetic coupling between the second sub line and the main line.

7. The directional coupler according to claim 2, wherein a cutoff frequency at which an attenuation of a signal passing between the third terminal and the fourth terminal decreases by a predetermined value lies outside the predetermined frequency band.

8. The directional coupler according to claim 2, further comprising:

a plurality of laminated dielectric layers; wherein the plurality of laminated dielectric layers include a main line layer including the main line, a first sub line layer including the first sub line, a second sub line layer including the second sub line, a third sub line layer including the third sub line, a first capacitor layer including the first capacitor, and a second capacitor layer including the second capacitor; and between the first capacitor layer and the second capacitor layer, the main line layer, the first sub line layer, the second sub line layer, and the third sub line layer are disposed.

9. The directional coupler according to claim 8, wherein the plurality of laminated dielectric layers further include first to fourth ground electrodes;

the first ground electrode and the second ground electrode overlap in a lamination direction in which the plurality of dielectric layers are laminated;

the third ground electrode and the fourth ground electrode overlap in the lamination direction;

a distance between the first ground electrode and the second ground electrode in the lamination direction is shorter than a distance between the third ground electrode and the fourth ground electrode in the lamination direction;

a first portion of the main line extending from the first terminal to a center point of the main line is disposed between the first ground electrode and the second ground electrode in the lamination direction;

a second portion of the main line extending from the second terminal to the center point of the main line is disposed between the third ground electrode and the fourth ground electrode in the lamination direction;

the first to third sub line layers are disposed between the third ground electrode and the fourth ground electrode;

the first ground electrode and the second ground electrode overlap the first portion in the lamination direction and do not overlap the first sub line, the second sub line, and the third sub line; and the third ground electrode and the fourth ground electrode overlap the second portion, the first sub line, the second sub line, and the third sub line in the lamination direction.

10. The directional coupler according to claim 8, wherein the first sub line layer is disposed between the main line layer and the third sub line layer; and the third sub line layer is disposed between the first sub line layer and the second sub line layer.

11. The directional coupler according to claim 10, wherein a distance between the second sub line layer and the third sub line layer is shorter than a distance between the first sub line layer and the third sub line layer.

12. The directional coupler according to claim 1, further comprising:

a fifth terminal;

a sixth terminal; and another sub line connected between the fifth terminal and the sixth terminal; wherein another low-pass filter is provided in the other sub line.

13. The directional coupler according to claim 1, wherein the first terminal is an input port, the second terminal is an output port, the third terminal is a coupler, and the fourth terminal is a termination port terminated at about 50Ω.

14. The directional coupler according to claim 5, wherein the capacitance of the second capacitor is larger than the capacitance of the first capacitor.

15. The directional coupler according to claim 5, wherein the capacitance of the second capacitor is smaller than the capacitance of the first capacitor.

16. The directional coupler according to claim 12, wherein the another sub line is divided into at least a fourth sub line, a fifth sub line, and a sixth sub line;

the directional coupler further includes:

a third capacitor provided between the ground potential and a third node between the fourth sub line and the fifth sub line; and a fourth capacitor provided between the ground potential and a fourth node between the fifth sub line and the sixth sub line;

the fourth sub line, the fifth sub line, and the sixth sub line are connected in series in this order and are each electromagnetically coupled to the main line; and the fourth sub line, the fifth sub line, the sixth sub line, the third capacitor, and the fourth capacitor define the another low-pass filter.

17. The directional coupler according to claim 16, wherein the fifth sub line is electromagnetically coupled to the sixth sub line.

18. The directional coupler according to claim 17, wherein the fourth sub line is electromagnetically coupled to each of the fifth sub line and the sixth sub line;

a degree of electromagnetic coupling between the fifth sub line and the sixth sub line is higher than a degree of electromagnetic coupling between the fourth sub line and the sixth sub line; and the degree of electromagnetic coupling between the fourth sub line and the sixth sub line is higher than a degree of electromagnetic coupling between the fourth sub line and the fifth sub line.

19. The directional coupler according to claim 18, wherein a capacitance of the fifth capacitor differs from a capacitance of the fourth capacitor.

20. The directional coupler according to claim 16, wherein a degree of electromagnetic coupling between the sixth sub line and the main line is higher than a degree of electromagnetic coupling between the fifth sub line and the main line.

* * * * *